United States Patent [19]

Murakami et al.

[11] Patent Number: 4,583,821
[45] Date of Patent: Apr. 22, 1986

[54] INFRARED FIBERS

[75] Inventors: Kazuhito Murakami; Kenichi Takahashi, both of Osaka, Japan

[73] Assignee: Sumitomo Electric Industries, Ltd., Osaka, Japan

[21] Appl. No.: 651,031

[22] Filed: Sep. 14, 1984

Related U.S. Application Data

[62] Division of Ser. No. 436,688, Oct. 26, 1982, Pat. No. 4,490,008.

[30] Foreign Application Priority Data

Nov. 9, 1981 [JP] Japan .................. 56-178399

[51] Int. Cl.⁴ .......................... D02G 3/00; G02B 5/14
[52] U.S. Cl. .................. 350/96.34; 428/375; 428/389; 428/390
[58] Field of Search ............... 428/364, 373, 375, 374, 428/379, 389, 390; 350/96.34

[56] References Cited

U.S. PATENT DOCUMENTS 4,253,731 3/1981 Anderson et al. ............... 350/96.34

FOREIGN PATENT DOCUMENTS

| 55-124103 | 9/1980 | Japan . | |
| 55-121406 | 9/1980 | Japan . | |
| 50-43606 | 4/1981 | Japan | 350/96.34 |
| 2077937 | 12/1981 | United Kingdom | 350/96.34 |

OTHER PUBLICATIONS

Kapany et al, "Infrared Fiber Optics", Quarterly Report (5) Contact AF 33(616)-6247, Jun. 14, 1960.
Cope, "Crystal Materials for Infrared Fibers", SPIE, vol. 266, Infrared Fibers (0.8–12 μm) (1981).
Vasilev et al, "Single-Crystal Fiber Waveguides for the Middle Range", Sov. J. Quantum Electron, 11 (6), Jun. 1981.

*Primary Examiner*—Lorraine T. Kendell
*Attorney, Agent, or Firm*—Wenderoth, Lind and Ponack

[57] ABSTRACT

This invention relates to an infrared fiber excellent in elongation as well as tensile strength and yield strength, which comprises a mixed crystal containing 0.01 to 10% by weight of silver chloride in silver bromide or a mixed crystal containing 0.01 to 10% by weight of silver bromide in silver chloride.

8 Claims, 4 Drawing Figures

FIG. 1  FIG. 2  FIG. 3
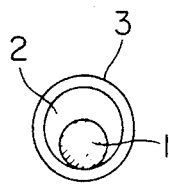
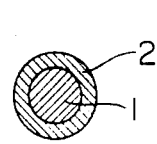
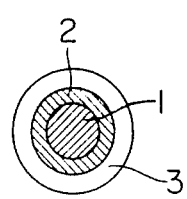
FIG. 4
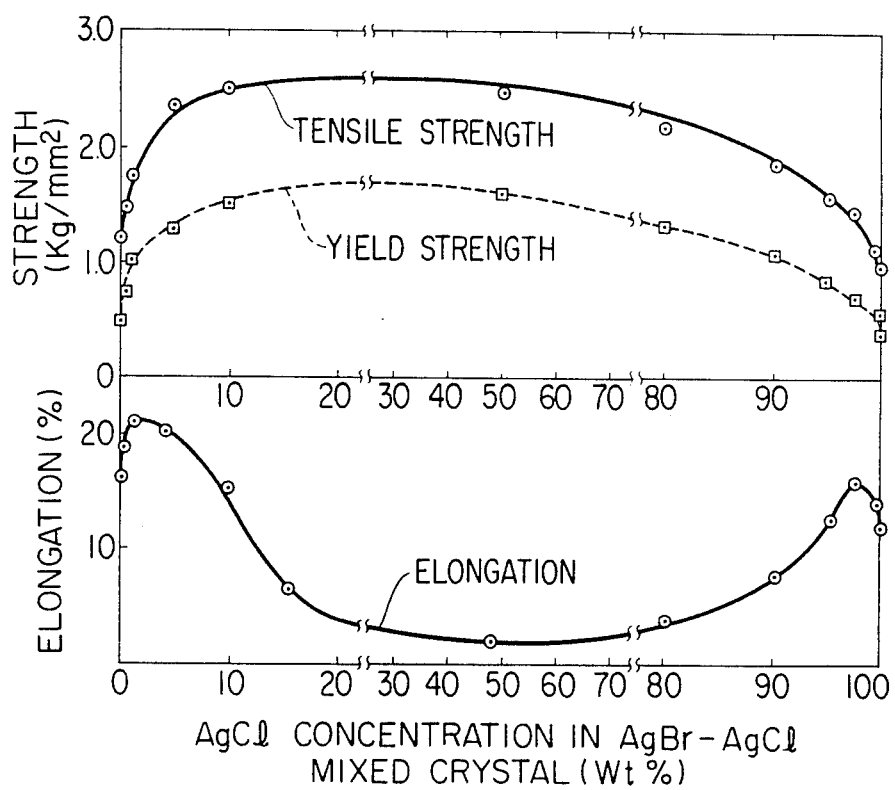

INFRARED FIBERS

This is a Rule 60 Divisional of Ser. No. 436,688, filed Oct. 26, 1982, now U.S. Pat. No. 4,490,008.

BACKGROUND OF THE INVENTION

1. Field of the Invention

This invention relates to infrared fibers and more particularly, it is concerned with infrared transmitting fibers consisting of mixed crystals of silver bromide and silver chloride.

2. Description of the Prior Art

Various efforts have hitherto been made to prepare infrared fibers by extruding infrared transmitting optical crystals or by growing fibrous single crystals ("Nikkei Electronics" 1980, Dec. 8, page 140). There have been proposed infrared fibers each comprising crystalline fiber 1 as a core inserted loosely in tubular protective layer 3 to retain gap 2 as a cladding as shown in FIG. 1, and infrared fibers of step index type as shown in FIG. 2 and FIG. 3.

Silver chloride and silver bromide are suitable for use as an infrared transmitting material because of having a wide transmission range and being capable of transmitting $CO_2$ laser beam (wavelength 10.6 $\mu$m) with a small loss.

Infrared fibers of silver halide crystals are known as a step index fiber of silver chloride clad silver bromide, which can be prepared by extruding silver halide optical crystals as described in Japanese Patent Application OPI (Kokai) No. 121406/1980 and U.S. Pat. No. 4253731. However, when an infrared fiber is made of such a combination of silver chloride and silver bromide, the disadvantages are unavoidable that its tensile strength and yield strength are small and when the fiber is extruded or bent it tends to be scratched or broken. This tendency is particularly remarkable when impurities are removed from the fiber materials so as to decrease the light transmission loss.

On the other hand, Japanese Patent Application OPI (Kokai) No. 124103/1980 describes an infrared fiber with a core consisting of silver bromide or a melt mixture of silver bromide and silver chloride and a cladding consisting of a melt mixture of silver bromide in a proportion less than in the core and silver chloride or silver chloride. In particular, the composition of the core comprising at most 50 mol % of silver bromide and the balance silver chloride, e.g. 5-30 mol % of silver bromide and the balance silver chloride is preferred from the standpoint of transmission characteristics. In this case, however, the tensile strength and yield strength are increased, but the elongation is decreased to a great extent and the fiber is hard and brittle and tends to be broken by operations such as bending.

SUMMARY OF THE INVENTION

It is an object of the present invention to provide an infrared fiber excellent in mechanical properties, whereby the above described disadvantages can be overcome.

It is another object of the present invention to provide an infrared transmitting fiber or silver halides with improved handling and durability.

It is a further object of the present invention to provide an infrared transmitting material consisting of a mixed crystal of silver bromide and silver chloride.

These objects can be attained by an infrared transmitting material consisting of a mixed crystal consisting of 0.01–10 wt % silver chloride and the balance silver bromide, or a mixed crystal consisting of 0.01–10 wt % silver bromide and the balance silver chloride.

BRIEF DESCRIPTION OF THE DRAWING

The accompanying drawings are to illustrate the principle and the merits of the present invention in greater detail.

FIG. 1 is a cross-sectional view of one form of an infrared fiber.

FIG. 2 is a cross-sectional view of another form of an infrared fiber.

FIG. 3 is a cross-sectional view of another form of an infrared fiber.

FIG. 4 is a graphical representation of strength (kg/mm$^2$) and elongation (%) vs. AgCl concentration (wt %) in AgBr-AgCl mixed crystal.

DETAILED DESCRIPTION OF THE INVENTION

The inventors have made studies on, in infrared fibers of silver halides such as silver chloride and silver bromide, the composition of mixed crystals thereof with a larger tensile strength, yield strength and elongation for the purpose of improving the handling property and durability of the fiber and consequently, have found that this purpose can be achieved by some specified compositions of the mixed crystals.

Accordingly, the present invention provides an infrared transmitting material consisting of a mixed crystal containing 0.01 to 10% by weight, preferably 0.01 to 5% by weight, more preferably 1 to 3.5% by weight of silver chloride in silver bromide, or a mixed crystal containing 0.01 to 10% by weight, preferably 0.01 to 5% by weight, more preferably 1 to 3.5% by weight of silver bromide in silver chloride, and an infrared fiber comprising the infrared transmitting material surrounded at the circumference thereof by a tubular protective layer. In addition, the present invention provides an infrared fiber comprising a core and a cladding, or a core, a cladding and a circumferential protective layer, the core consisting of a mixed crystal containing at most 10% by weight, preferably at most 5% by weight of silver chloride in silver bromide and the cladding consisting of a mixed crystal containing at most 10% by weight of silver bromide in silver chloride.

The mechanical properties of mixed crystals of silver bromide and silver chloride are examined as follows:

Silver chloride and silver bromide powders were suitably mixed, melted at 480° C. and crystallized by the Bridgman method. The resulting crystal was subjected to a solution treatment at 400° C. for 24 hours to obtain a mixed crystal with a homogeneous composition. The thus obtained mixed crystals with various compositions were subjected to hot extrusion at an extruding temperature of 180° to 350° C. to form fibers of 0.1 to 1.5 mm in diameter and then subjected to a tension test, thus obtaining results as shown in FIG. 4. As in evident from FIG. 4, mixed crystals containing 0.01–10% by weight, particularly, 0.01–5% by weight, more particularly 1 to 3.5% by weight of silver bromide in silver chloride, or mixed crystals containing 0.01–10% by weight, particularly, 0.01–5% by weight, more particularly 1 to 3.5% by weight of silver chloride in silver bromide are within a range with a larger tensile strength, yield strength and elongation.

The mixed crystal fibers of these compositions are superior to a fiber consisting of silver bromide alone in scratch resistance, flexibility, mechanical stability and brittleness that is often a defect of mixed crystal fibers with large amounts of additives.

Particularly, in the case of a mixed crystal containing 1-3.5% by weight of AgCl in AgBr or a mixed crystal containing 1-3.5% by weight AgBr in AgCl, the elongation amounts to its maximum and, accordingly, the fiber made of such a mixed crystal as in this range has a stable and good elongation property suitable for practical use.

In one embodiment of the present invention, the mixed crystal fiber with a composition in the above described range is inserted in a tubular protective layer to thus obtain an infrared fiber excellent in mechanical properties, comprising core 1, cladding 2 and tubular protective layer 3, the cladding being a gap between core 1 and protective layer 3, as shown in FIG. 1.

As the tubular protective layer, there can be used soft and porous plastics or rubbers functioning as a buffer, such as polyurethanes, polystyrene, ABS resins, polyvinyl chloride, polyethylene, polypropylene, phenol resins, silicone resins, urea resins and fluorine resins. If necessary, this tubular protective layer can further be coated with a water-proof and dense plastic or rubber, for example, by melt extrusion of ABS resins, polybutadiene, polypropylene, polycarbonates, polyvinyl chloride, polyphenylene oxide, polysulfone or mixtures thereof, or by applying and baking polyester imides, polyesters, polyurethanes, polyols, polyimides, polyamideimides, silicone resins, tetrafluoro resins, epoxy resins or mixtures thereof. As the exterior coating layer, there can be used a heat-shrinkable tube such as of polyethylene, polyvinyl chloride, polyethylene/polyvinyl acetate copolymers, chlorinated polyethylenes, polyvinyl fluoride and the like. In addition, electron beam-irradiated polyolefins (e.g. Sumitube-commercial name-) can also be used. These resins can optionally be used in the form of a single layer or multi-layer.

In another embodiment of the present invention, an infrared fiber is composed of core 1 and cladding 2 consisting of mixed crystals differing in refractive index, as shown in FIG. 2 and FIG. 3. Since mixed crystals containing 0.01 to 10% by weight, preferably 0.01 to 5% by weight, more preferably 1 to 3.5% by weight of silver chloride in silver bromide have a refractive index of about 2.1 at 10.6 μm wavelength and mixed crystals containing 0.01 to 10% by weight, preferably 0.01 to 5% by weight more preferably 1 to 3.5% by weight of silver bromide in silver chloride have a refractive index of about 2 at 10.6 μm wavelength, core 1 is made of the former mixed crystal and cladding 2 is made of the latter mixed crystal, thus obtaining an infrared fiber as shown in FIG. 2 and FIG. 3, which can guide infrared rays in the core and which is excellent in mechanical properties and has an excellent tensile strength, yield strength, elongation, scratch resistance and flexibility similar to those of the above described mixed crystals. Even though bending is employed to cause plastic deformation, this infrared fiber shows a larger tensile strength as well as elongation and is resistant to breakage and repeated bending and mechanically stable.

As protective layer 3, there can be used plastics or rubbers such as coated onto the above described tubular protective layer, which can directly be coated onto cladding 2 as monolayer or multi-layer.

The infrared fiber of the present invention is available for $CO_2$ or CO laser beam waveguides in laser devices for surgical operations such as laser scapel and laser coagulator or for infrared waveguides, e.g. to be connected with an infrared detector in a remote alarm system.

The following examples are given in order to illustrate the present invention in greater detail without limiting the same.

EXAMPLE 1

High purity silver chloride and silver bromide powders were mixed in a proportion by weight of 99:1 and crystallized by the Bridgman method to form a cylindrical crystal. This crystal was subjected to a solution treatment at 350° to 410° C. for 24 hours to obtain a mixed crystal with a homogeneous composition and extruded to form a billet, which was then subjected to hot extrusion at an extruding temperature of 100° to 380° C. by heating the billet and extruding mold using an external heater to form a fiber of 0.5-1.5 mm in diameter.

EXAMPLE 2

High purity silver chloride and silver bromide powders were mixed in a proportion by weight of 2:98, crystallized by the Bridgman method to form a cylindrical crystal and then subjected to hot extrusion in an analogous manner to Example 1, thus obtaining a fiber with a diameter of 0.5-1.5 mm.

The thus obtained crystalline fibers of Examples 1 and 2 were scratch-resistant and flexible fibers and were respectively inserted loosely into resin tubes consisting of fluorine resin (Teflon-commercial name-)coated further with water-proof and heat-shrinkable electron beam-irradiated polyolefin (Sumitube-commercial name-) in multilayer to form infrared fibers.

EXAMPLE 3

A cylindrical crystal of the mixed crystal with the composition of Example 2 and a tubular crystal of the mixed crystal with the composition of Example 1 were prepared and set each other to form a billet for extrusion, which was then subjected to hot extrusion in an analogous manner to Example 1 to obtain a fiber with a diameter of 0.5-1.5 mm. This fiber was a step index fiber which was scratch resistant and flexible similarly to the fibers of Examples 1 and 2 and in which the core portion was of the mixed crystal having the composition of Example 2 and the cladding portion was of the mixed crystal having the composition of Example 1.

The crystalline fiber of Example 3, in which light was guided in core 1 by cladding 2, was coated with a protective layer of a resin layer and metallic layer to give an infrared fiber, as in ordinary fibers for optical communication.

The thus obtained infrared fiber was cut in a length of 2 m and used for boring or cutting a plastic plate such as acrylic plate or wood by allowing $CO_2$ gas laser beam with an input of 10 W (wavelength 10.6 μm) to enter one end of the infrared fiber and to leave the other end thereof and focusing through a converging lens for infrared rays, e.g. zinc selenide lens.

EXAMPLE 4

The procedure of Example 1 was repeated except changing the proportion of silver chloride and silver bromide as shown in the following table, thus obtaining fibers with a diameter of 0.5–1.5 mm and with elongation data in a tension test as shown in this table.

| Sample No. | Sample Composition (wt %) | | Elongation (%) |
|---|---|---|---|
| | AgCl | AgBr | |
| 1 (Comparison) | 0 | 100 | 17 |
| 2 | 1 | 99 | 19 |
| 3 (Example 2) | 2 | 98 | 21 |
| 4 | 3 | 97 | 20 |
| 5 | 3.5 | 96.5 | 21 |
| 6 | 5 | 95 | 18 |
| 7 | 10 | 90 | 16 |
| 8 (Comparison) | 100 | 0 | 13 |
| 9 (Example 1) | 99 | 1 | 15 |
| 10 | 98 | 2 | 17 |
| 11 | 97 | 3 | 17 |
| 12 | 96.5 | 3.5 | 15 |
| 13 | 95 | 5 | 13 |
| 14 | 90 | 10 | 8 |

What is claimed is:

1. An infrared fiber comprising a crystalline fiber consisting of a mixed crystal containing 0.01 to 10% by weight of silver chloride in silver bromide or a mixed crystal containing 0.01 to 10% by weight of silver bromide in silver chloride, and a tubular protective layer of plastic or rubber provided around the crystalline fiber.

2. The infrared fiber of claim 1, wherein the mixed crystal contains 0.01 to 5% by weight of silver chloride in silver bromide.

3. The infrared fiber of claim 2, wherein the mixed crystal contains 1 to 3.5% by weight of silver chloride in silver bromide.

4. The infrared fiber of claim 1, wherein the mixed crystal contains 0.01 to 5% by weight of silver bromide in silver chloride.

5. The infrared fiber of claim 4, wherein the mixed crystal contains 1 to 3.5% by weight of silver bromide in silver chloride.

6. The infrared fiber of claim 1, wherein the tubular protective layer is of a soft and porous plastic or rubber.

7. The infrared fiber of claim 6, wherein the protective layer is further coated with a water-proof and dense plastic or rubber.

8. The infrared fiber of claim 6, wherein the plastic or rubber is selected from the group consisting of polyurethanes, polystyrene, ABS resins, polyvinyl chloride, polyethylene, polypropylene, phenol resins, silicone resins, urea resins and fluoro resins.

* * * * *